(12) United States Patent
Ochi et al.

(10) Patent No.: US 11,362,649 B1
(45) Date of Patent: Jun. 14, 2022

(54) CIRCUIT AND METHOD FOR ADAPTIVELY ELIMINATING RINGING IN SIGNALS DRIVING CAPACITIVE LOADS

(71) Applicants: Analog Power Conversion LLC, Bend, OR (US); Kyosan Electric Manufacturing Co., Ltd., Yokohama (JP)

(72) Inventors: Sam Seiichiro Ochi, Lakewood Ranch, FL (US); Tetsuya Takata, Yokohama (JP); Itsuo Yuzurihara, Yokohama (JP); Tomohiro Yoneyama, Yokohama (JP); Yu Hosoyamada, Yokohama (JP)

(73) Assignees: Analog Power Conversion LLC, Bend, OR (US); Kyosan Electric Manufacturing Co., Ltd., Yokohama (JP)

( * ) Notice: Subject to any disclaimer, the term of this patent is extended or adjusted under 35 U.S.C. 154(b) by 0 days.

(21) Appl. No.: 17/475,205

(22) Filed: Sep. 14, 2021

(51) Int. Cl.
*H03K 5/125* (2006.01)
*H03K 5/1252* (2006.01)
*H03K 3/037* (2006.01)
*H03K 19/21* (2006.01)
*H03K 5/00* (2006.01)

(52) U.S. Cl.
CPC ........... *H03K 5/1252* (2013.01); *H03K 3/037* (2013.01); *H03K 19/21* (2013.01); *H03K 2005/00019* (2013.01)

(58) Field of Classification Search
CPC combination set(s) only.
See application file for complete search history.

(56) References Cited

U.S. PATENT DOCUMENTS

| 7,956,651 B2* | 6/2011 | Ptacek | H03K 5/1536 327/75 |
| 2011/0169531 A1* | 7/2011 | Scholder | H03K 5/1536 327/79 |

* cited by examiner

*Primary Examiner* — Long Nguyen

(57) ABSTRACT

A control signal may be produced in response to an assertion of a switch signal by asserting the control signal, waiting an adaptive delay after the assertion of the switch signal, de-asserting the control signal in response to the expiration of the adaptive delay, and re-asserting the control signal in response to a current generated according to the control signal becoming zero. The adaptive delay may be adjusted according to a voltage generated using the current. A circuit may include an XOR gate producing the control signal from a switch signal and an output of a Set-Reset Flip-Flop (SRFF), a zero-detect circuit that resets the SRFF when a current generated using the control circuit becomes zero, and a delay circuit to set the SRFF an adaptive delay after assertion of the switch signal and to adjust the adaptive delay according to a voltage generated by the current.

20 Claims, 5 Drawing Sheets

CIRCUIT AND METHOD FOR ADAPTIVELY ELIMINATING RINGING IN SIGNALS DRIVING CAPACITIVE LOADS

BACKGROUND

Many devices present primarily capacitive loads on their control inputs. Examples include the gates of Metal-Oxide-Semiconductor Field Effect Transistors (MOSFETs), including devices ranging from MOSFETs of digital logic circuits to power MOSFETs. For simplicity of explanation, the description below will be made in terms of MOSFETs, where the control input is a gate, and the capacitive load includes a gate capacitance.

When MOSFETs are operated in a switched mode having an on state and an off state, the highest performance in terms of both frequency and energy efficiency may be achieved by minimizing the time required to transition between the on state and off state and between the off state and on state. Whether a MOSFET is on or off is determined by a gate voltage present across the gate capacitance. Therefore, minimizing the time required for the off/on and on/off transition of the MOSFET may be achieved by minimizing a rise time $t_r$ and a fall time $t_f$ of the gate voltage.

However, circuit inductances associated with the gate may lead to ringing of a control signal provided to the gate capacitance when the control signal is underdamped, may result in damage the MOSFET. On the other hand, when the control signal is overdamped, the rise time $t_r$ and fall time $t_f$ of the control signal are increased. A circuit that is neither overdamped or underdamped is called a critically damped circuit.

Critical damping may be achieved by incorporating an output resistance in the path of the control signal. However, the value of the output resistor needed to achieve critical damping depends on the load capacitance and the inductance in the circuit, among other factors, which can both vary based on manufacturing variations and operational environmental conditions.

Accordingly, a need exists for circuits and methods for minimizing the time to switch a capacitive load having an associated inductance while preventing ringing in the control signal switching the capacitive load, where the circuits automatically adapt to variations in circuit parameters and changing operational environmental conditions.

SUMMARY OF THE INVENTION

Embodiments relate to switching of a capacitive load; for example, switching a gate of a power MOSFET. Specifically, embodiments relate to minimizing ringing by controlling the rise and fall of a control signal provided to the capacitive load.

In an embodiment, a circuit for driving a control signal comprises a zero detect circuit, a first adaptive delay circuit, and an output circuit. The zero detect circuit produces a zero detect signal indicating a current generated according to the control signal becoming zero. The first adaptive delay circuit receives a switch signal, produces a first delay signal indicating that a first adaptive delay has elapsed since an assertion of the switch signal, and adjusts the first adaptive delay according to a first target voltage and an output voltage generated using the current. The output circuit, when the switch signal is asserted, asserts the control signal in response to the assertion of the switch signal, de-assert the control signal in response to the first delay signal indicating that the first adaptive delay has elapsed since the assertion of the switch signal, and re-assert the control signal in response to the zero detect signal indicating the current becoming zero.

In an embodiment, a method of producing an output signal comprises in response to an assertion of a switch signal: asserting the control signal, waiting a first adaptive delay after the assertion of the switch signal, de-asserting the control signal in response to the expiration of the first adaptive delay, and asserting the control signal in response to a current generated according to the control signal becoming zero. The method further comprises adjusting the first adaptive delay according to a first voltage generated using the current.

In an embodiment, a circuit for driving a control signal comprises an Exclusive-OR (XOR) circuit, a Set-Reset Flip-Flop (SRFF), a zero-detect circuit, and a delay circuit. The XOR gate has a first input coupled to a switch signal, a second input coupled to an output of the SRFF, and an output coupled to the control signal. The zero-detect circuit provides a pulse to a Reset input of the SRFF in response to a current generated according to the control circuit becoming zero. The delay circuit provides a first pulse to a Set input of the SRFF a first adaptive delay after an assertion of the switch signal and adjusts the first adaptive delay according to a voltage generated by the current.

DETAILED DESCRIPTION

Embodiments of the present application relate to enabling robust switching of capacitive loads without overshoot or undershoot. Specifically, embodiments may automatically adapt to changes in device parameters so as to prevent ringing in a control signal while providing fast rise times $t_r$ and fall times $t_f$ of the control signal.

The present disclosure may relate to power semiconductor devices such as power MOSFETs.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

As used herein, a signal is asserted when it has a value corresponding to logical-true or to an active or on state of the device or circuit being controlled by the signal, and is de-asserted when it has a value corresponding to logical-false or to an inactive or off state of the device or circuit being controlled by the signal. Assertion of a signal refers to the act of driving the signal from the de-asserted to the asserted state, and de-assertion of the signal refers to the act of driving the signal from the asserted to the de-asserted state. The example embodiments presented herein use active-high signals where assertion of a signal corresponds to driving the signal to a high value which may correspond to 1 or logical-true (i.e., to a rising edge) and de-assertion of the a signal corresponds to falling edge that driving the signal to a low value which may correspond to 0 or logical-false (i.e., to a falling edge), but embodiments are not limited thereto, and in other embodiments, some or all of the signals may be active-low signals instead.

Figure 1:
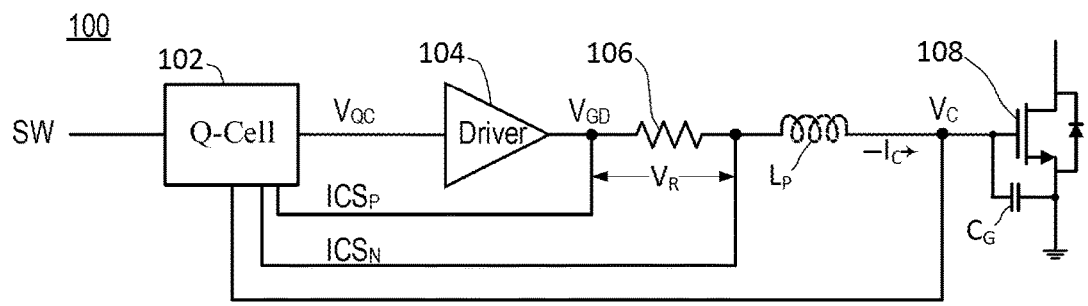
FIG. 1 illustrates a circuit for driving a capacitive load according to an embodiment.

FIG. 1 illustrates a circuit 100 according to an embodiment. The circuit 100 includes a Q-Cell logic circuit 102, a driver circuit 104, a resistor 106, and an n-channel MOSFET 108. Also shown in FIG. 1 is an interconnect inductance $L_P$ corresponding to a parasitic inductance of the connection between the driver 104 and the MOSFET 108, and a gate capacitance $C_G$ corresponding to the gate capacitance between the gate and the source of the MOSFET 108.

The Q-Cell logic circuit 102 receives a switching signal SW. The Q-cell circuit may also receive a positive and negative current sense signals $ICS_P$ and $ICS_N$ and a gate capacitance voltage $V_C$. The Q-cell circuit produces a Q-cell signal $V_{QC}$ according to the switch signal SW, a current to the gate of the MOSFET 108 determined using current sense signals $ICS_P$ and $ICS_N$, and timing parameters determined using the capacitance voltage $V_C$, as explained below.

The driver circuit 104 generates the gate driver output $V_{GD}$ according to the Q-cell signal $V_{QC}$. In embodiments, the gate driver circuit 104 may provide current buffering, output impedance matching, voltage translation, or the like.

Although the circuit 100 of FIG. 1 includes a driver circuit 104, embodiments are not limited thereto, and in other embodiments the driver circuit 104 is absent and the Q-Cell logic circuit 102 drives the gate of the MOSFET 108. Furthermore, embodiments are not limited to driving devices like the n-channel MOSFET 108 of FIG. 1, and may instead drive p-channel MOSFETS, Insulated-Gate Bipolar Transistors (IGBT), or the like.

The resistor 106 operates to provide damping of the gate driver output $V_{GD}$. In an embodiment, the resistor 106 is not a separate component, but instead represents the output resistance of the driver circuit 104.

The parameters used to determine the value of the resistor 106 may include an output impedance of the driver circuit 104, the interconnect inductance $L_P$ of the connection coupling the driver circuit 104 to the MOSFET 108 through the resistor 106, and the gate capacitance $C_G$ of the MOSFET 108. The parameters may be estimated for an anticipated operating environment, such as an anticipated operating temperature.

In an embodiment, the resistor 106 has a value chosen according to the estimated circuit parameters and operating conditions to critically damp the gate driver output $V_{GD}$; for example, the resistance R of resistor 106 may be equal to $$R = \frac{2 \cdot L_P}{\sqrt{L_P \cdot C_G}} \qquad \text{Equation 1}$$

where $L_P$ is an estimated inductance of the interconnect inductance $L_P$ and $C_G$ is an estimated capacitance of a gate capacitance $C_G$; for example, when C is 400 picofarads and L is 1 nanohenry, R may be 3.1 ohms. In another embodiment wherein the Q-cell circuit 102 is relied on to prevent ringing, the resistor 106 has a value chosen to underdamp the gate driver output $V_{GD}$; that is, the resistance R of resistor 106 may be substantially less than the resistance indicated by Equation 1; for example, given the capacitance and inductance values above, the resistance of resistor 106 may be 2 ohms. However, embodiments are not limited to the resistor values used in the examples above.

Furthermore, although the circuit 100 of FIG. 1 drives only a single capacitive load (the single MOSFET 108), embodiments are not limited thereto, and in embodiments, a plurality of capacitive loads connected in parallel may be driven.

Figure 2A:
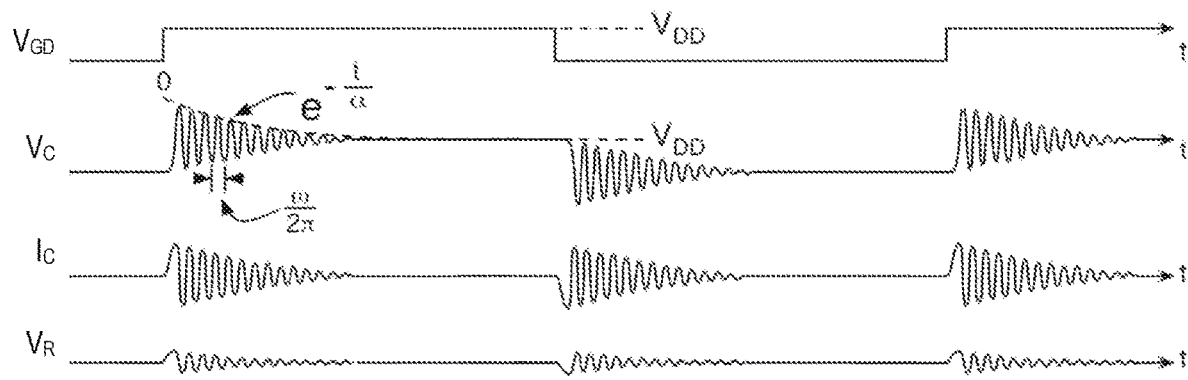
FIG. 2A illustrates undershoot and overshoot in an underdamped drive signal.

FIG. 2A illustrates operation of a circuit such as shown in FIG. 1 in the absence of the Q-cell circuit 102, that is, if the switch signal SW were directly coupled to the input of the driver circuit 104. FIG. 2A is provided to show advantages of embodiments of the present disclosure by providing a contrast to FIG. 2B. FIG. 2A illustrates an output voltage $V_{GD}$ of a driver circuit such as driver circuit 104, a capacitance voltage $V_C$ across a load capacitance such as the gate capacitance $C_G$ of MOSFET 108, a capacitance current $I_C$ flowing to the load capacitance, and a voltage drop $V_R$ across an output resistance such as the resistor 106.

In FIG. 2A, the circuit comprising the resistor 106, interconnect inductance $L_P$, and gate capacitance $C_G$ is assumed to be underdamped. As a result, when the gate driver output $V_{GD}$ transitions from low to high, ringing occurs with a frequency f of $\omega/2\pi$, equal to:

$$f = \frac{1}{2\pi} \cdot \sqrt{\frac{1}{LC} + \left(\frac{R}{2L}\right)^2} \qquad \text{Equation 2}$$

The amplitude of the ringing decays at an exponential rate $e^{-t/\alpha}$, where $\alpha = R/2$ L.

As can be seen in FIG. 2A, the ringing that occurs in response to the low to high transition of the gate driver output $V_{GD}$ causes the gate capacitance voltage $V_C$ to rise above the maximum voltage value $V_{DD}$ of the gate driver output $V_{GD}$. Furthermore, the ringing causes the voltage drop $V_R$ across the resistor 106 to experience additional periods of time when it is non-zero; during these periods, power is dissipated as heat in the resistor 106.

Similar effects occur in response to the high to low transition of the gate driver output $V_{GD}$. The ringing that occurs in response to the high to low transition of the gate driver output $V_{GD}$ causes the gate capacitance voltage $V_C$ to drop below zero; that is, to go negative. Furthermore, the ringing causes the voltage drop $V_R$ across the resistor 106 to experience additional periods of time when it is non-zero; during these periods, power is dissipated as heat in the resistor 106.

The excursions of the gate capacitance voltage $V_C$ above the maximum voltage value $V_{DD}$ and below zero may have detrimental effects on the circuit 100. Furthermore, the power dissipated as heat in the resistor 106 not only wastes energy but also may require additional measures to be taken to remove heat from the circuit 100, increasing the cost, complexity, size, or a combination thereof of a device employing the circuit 100.

Figure 2B:
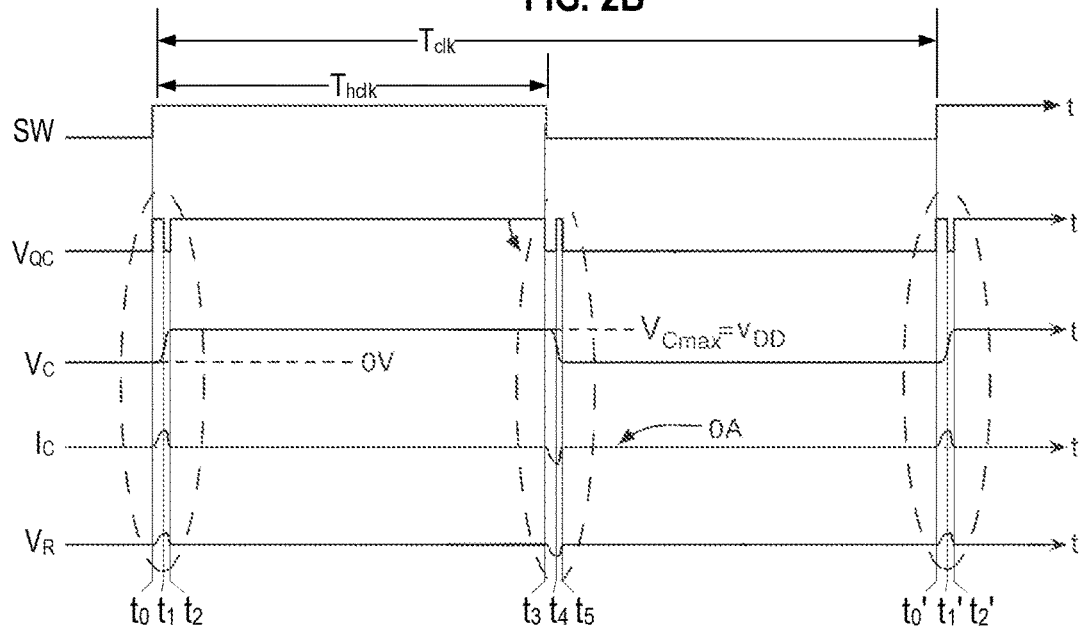
FIG. 2B illustrates operation of the circuit of FIG. 1 according to an embodiment.

FIG. 2B illustrates operation of the circuit 100 shown in FIG. 1. FIG. 2B illustrates the switch signal SW, the Q-cell signal $V_{QC}$ output by the Q-Cell logic circuit 102, the capacitance voltage $V_C$ across the gate capacitance $C_G$ of MOSFET 108, a capacitance current $I_C$ flowing to the gate capacitance $C_G$, and a voltage drop $V_R$ across the resistor 106.

In FIG. 2B, the switch signal SW is a binary signal with a clock period $T_{clk}$ and an asserted (high) duration $T_{clkh}$ within each clock cycle.

At a zeroth time $t_0$, at the beginning of a first clock period, the switch signal SW transitions from low to high. In response, the Q-Cell logic circuit 102 asserts the Q-cell signal $V_{QC}$, which causes the driver circuit 104 to assert the gate driver output $V_{GD}$ after a propagation delay time. This causes the capacitance current $I_C$ to be sourced through the resistor 106, which causes the capacitance voltage $V_C$ to rise, energy to be stored in a magnetic field of the interconnect inductance $L_P$, and a voltage drop $V_R$ across the resistor 106.

At a first time $t_1$ occurring a first adaptive delay after the zeroth time $t_0$, the Q-Cell logic circuit 102 de-asserts the Q-cell signal $V_{QC}$. This causes the driver circuit 104 to de-assert the gate driver output $V_{GD}$ after the propagation delay time. In response to the de-assertion of the gate driver output $V_{GD}$, the energy stored in the magnetic field of the interconnect inductance $L_P$ discharges, thereby continuing to source the capacitance current $I_C$ into the gate capacitance $C_G$, causing the capacitance voltage $V_C$ to continue to rise and a voltage drop $V_R$ across the resistor 106.

A second time $t_2$ corresponds to the energy stored in the magnetic field of the interconnect inductance $L_P$ being completely discharged, which causes the capacitance current $I_C$ to be zero. The Q-Cell logic circuit 102 detects the capacitance current $I_C$ becoming zero (such as by detecting that the voltage drop $V_R$ across resistor 106 is zero) and in response re-asserts the Q-cell signal $V_{QC}$, which causes the driver circuit 104 to re-assert the gate driver output $V_{GD}$ after a propagation delay time. In an embodiment, detecting the capacitance current $I_C$ becoming zero may be performed by detecting a zero-crossing of the capacitance current $I_C$. In another embodiment, detecting the capacitance current $I_C$ becoming zero may be performed by detecting that a magnitude of the capacitance current $I_C$ is less than a zero detect threshold value.

If at the second time $t_2$ the capacitance voltage $V_C$ is equal to the maximum voltage value $V_{DD}$ of the gate driver output $V_{GD}$, the capacitance current $I_C$ will remain at zero when the gate driver output $V_{GD}$ is asserted. However, when the capacitance voltage $V_C$ is less than or greater than the maximum voltage value $V_{DD}$ at the second time $t_2$, the Q-Cell logic circuit 102 will adjust the first adaptive delay that determines how soon the first time $t_1$ follows after the zeroth time t0 (that is, how long the Q-Cell logic circuit 102 first asserts the Q-cell signal $V_{QC}$ in response to the assertion of the switch signal SW).

In an embodiment, the Q-Cell logic circuit 102 may reduce the first adaptive delay time when the capacitance voltage $V_C$ is greater than the maximum voltage value $V_{DD}$ at the second time $t_2$, and may increase the first adaptive delay time when the capacitance voltage $V_C$ is less than the maximum voltage value $V_{DD}$ at the second time $t_2$. As a result, the first adaptive delay time may converge to a value that causes the capacitance voltage $V_C$ to reach the maximum voltage value $V_{DD}$ at the second time $t_2$ that corresponds to the capacitance current $I_C$ becoming zero.

At a third time $t_3$, within the first clock period, the switch signal SW transitions from high to low. In response, the Q-Cell logic circuit 102 de-asserts the Q-cell signal $V_{QC}$, which causes the driver circuit 104 to de-assert the gate driver output $V_{GD}$ after a propagation delay time. This causes the capacitance current $I_C$ to be sunk through the resistor 106, which causes the capacitance voltage $V_C$ to decrease, energy to be stored in a magnetic field of the interconnect inductance $L_P$, and a voltage drop $V_R$ across the resistor 106.

At a fourth time $t_4$ occurring a second adaptive delay after the third time $t_3$, the Q-Cell logic circuit 102 asserts the Q-cell signal $V_{QC}$. This causes the driver circuit 104 to assert the gate driver output $V_{GD}$ after the propagation delay time. In response to the assertion of the gate driver output $V_{GD}$, the energy stored in the magnetic field of the interconnect inductance $L_P$ discharges, thereby continuing to sink the capacitance current $I_C$ out of the gate capacitance $C_G$, causing the capacitance voltage $V_C$ to continue to decrease and a voltage drop $V_R$ across the resistor 106.

A fifth time $t_5$ corresponds to the energy stored in the magnetic field of the interconnect inductance $L_P$ being completely discharged, which causes the capacitance current $I_C$ to be zero. The Q-Cell logic circuit 102 detects the capacitance current $I_C$ becoming zero (such as by detecting that the voltage drop $V_R$ across resistor 106 is zero) and in response de-asserts the Q-cell signal $V_{QC}$ again, which causes the driver circuit 104 to again de-assert the gate driver output $V_{GD}$ after a propagation delay time.

If at the fifth time $t_5$ the capacitance voltage $V_C$ is equal to zero, the capacitance current $I_C$ will remain at zero when the gate driver output $V_{GD}$ is again de-asserted. However, when the capacitance voltage $V_C$ is less than or greater than zero at the fifth time $t_5$, the Q-Cell logic circuit 102 will adjust the second adaptive delay that determines how soon the fourth time $t_4$ follows after the third time $t_3$ (that is, how long the Q-Cell logic circuit 102 first de-asserts the Q-cell signal $V_{QC}$ in response to the de-assertion of the switch signal SW).

In an embodiment, the Q-Cell logic circuit 102 may increase the second adaptive delay time when the capacitance voltage $V_C$ is greater than zero at the fifth time $t_5$, and may decrease the second adaptive delay time when the capacitance voltage $V_C$ is less than zero at the fifth time $t_5$. As a result, the second adaptive delay time may converge to a value that causes the capacitance voltage $V_C$ to reach zero at the fifth time $t_5$ that corresponds to the capacitance current $I_C$ becoming zero.

When the first and second adaptive delay times have converged as described above, there is no energy in the interconnect inductance $L_P$ after the second time $t_2$ or after the fifth time $t_5$; as a result, because the capacitance voltage $V_C$ is, at the time, equal to the gate driver output $V_{GD}$, there is nothing to generate current in the circuit comprising the resistor 106, interconnect inductance $L_P$, and gate capacitance $C_G$, and therefore no ringing occurs. When no ringing occurs, the detrimental effects of ringing (such as wasted energy or increased signal noise) are eliminated.

Figure 3:
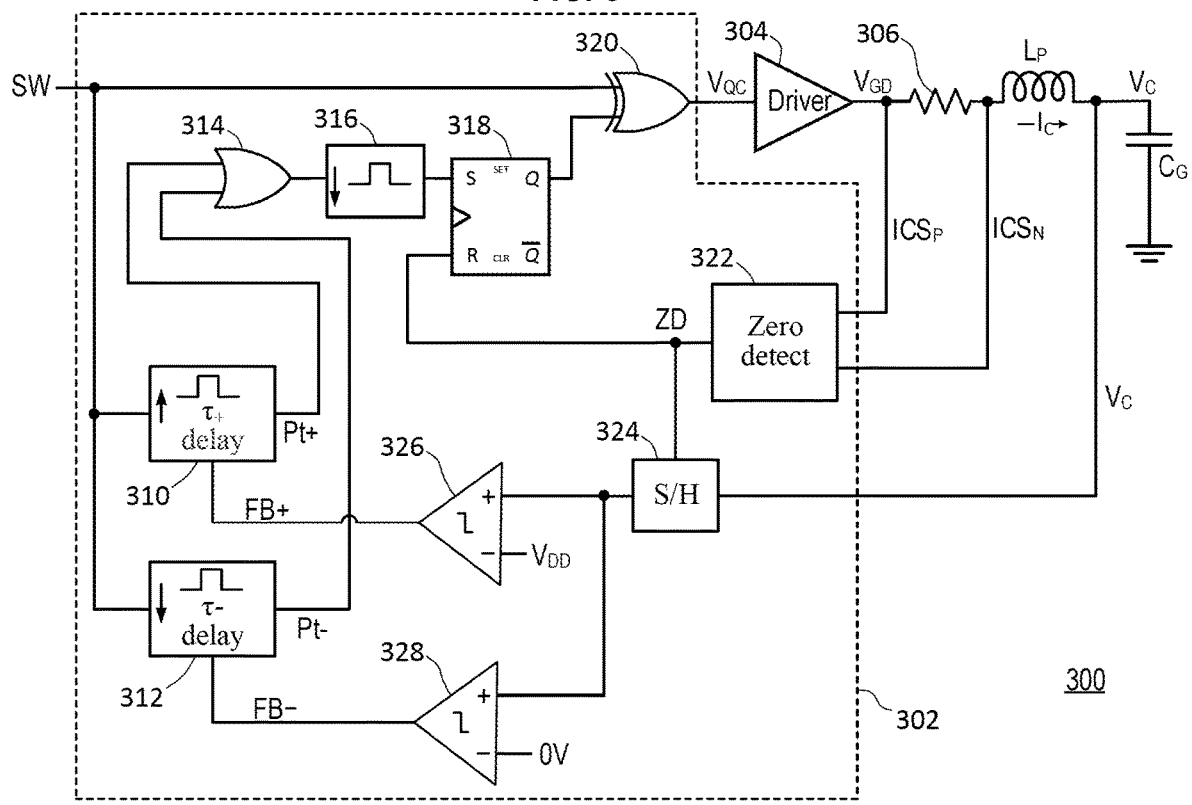
FIG. 3 illustrates a Q-cell logic circuit according to an embodiment.

FIG. 3 illustrates a circuit 300 including a Q-Cell logic circuit 302 according to an embodiment. The circuit 300 also includes a driver circuit 304, a resistor 306, an interconnect inductance $L_P$, and a gate capacitance $C_G$. The driver circuit 304, resistor 306, interconnect inductance $L_P$, and load capacitance $C_G$ of FIG. 3 correspond to the driver circuit 104, resistor 106, interconnect inductance $L_P$, and gate capacitance $C_G$ of FIG. 1, and accordingly description thereof are omitted in the interest of brevity. In embodiments, the driver circuit 304 and resistor 306 may be absent, and the Q-Cell logic circuit 302 may drive the gate capacitance $C_G$ through the interconnect inductance $L_P$, but embodiments are not limited thereto.

The Q-Cell logic circuit 302 includes a positive adaptive delay circuit 310, a negative adaptive delay circuit 312, an OR gate 314, a pulse generator 316, a Set-Reset Flip-Flop (SRFF) 318, an Exclusive-OR (XOR) gate 320, a zero detect circuit 322, a sample-and hold (S/H) circuit 324, a positive-level comparator 326, and a negative-level comparator 328.

The Q-Cell logic circuit 302 receives a switch signal SW for controlling the a capacitance voltage $V_C$ of a gate capacitance $C_G$, a positive current sense signal $ICS_P$ and a negative current sense signal $ICS_N$ that may be used to measure a capacitance current $I_C$ flowing into the gate capacitance $C_G$, and a capacitance voltage $V_C$ corresponding to the voltage on the gate capacitance $C_G$. The Q-Cell logic circuit 302 produces a Q-cell signal $V_{QC}$ that may be used to drive the gate capacitance $C_G$ without generating undesired ringing.

The positive adaptive delay circuit 310 generates a positive delay signal Pt+ in response to a positive transition (i.e., an assertion of) the switch signal SW. The positive delay signal Pt+ has an asserted duration equal to a positive delay τ+, which may correspond to the first adaptive delay described with respect to FIGS. 1, 2A, and 2B. The positive adaptive delay circuit 310 adjusts the value of the positive delay τ+ according to a positive feedback signal FB+.

An initial value of the positive delay τ+ may be determined according to $$\tau + = \frac{\pi}{2}\sqrt{L_E C_E} \qquad \text{Equation 3}$$

where $L_E$ is the estimated inductance of the interconnect inductance $L_P$ and $C_E$ is the estimated capacitance of the gate capacitance $C_G$ at the expected operating conditions. For example, when the estimated capacitance $C_E$ is 400 picofarads and the estimated inductance $L_E$ is 400 picohenries, the initial value for the positive delay τ+ may be 620 picoseconds. The value of the positive delay τ+ may be adjusted cycle by cycle to accommodate for differences between actual and estimated values for L, C, and the resistance R of resistor 106, and for value differences in these parameters that may arise due to, for example, age, temperature, offsets, delays, or package stress. In an embodiment, the value of the positive delay τ+ may vary within a range from 100 picoseconds to 100 nanoseconds, but embodiments are not limited thereto.

The negative adaptive delay circuit 312 generates a negative delay signal Pt− in response to a negative transition (i.e., a de-assertion of) the switch signal SW. The negative delay signal Pt− has an asserted duration equal to a negative delay τ−, which may correspond to the second adaptive delay described with respect to FIGS. 1, 2A, and 2B. The negative adaptive delay circuit 312 adjusts the value of the negative delay τ− according to a negative feedback signal FB−.

An initial value of the negative delay τ− may be determined according to $$\tau - = \frac{\pi}{2}\sqrt{L_E C_E} \qquad \text{Equation 4}$$

The value of the negative delay τ− may be adjusted cycle by cycle to accommodate for differences between actual and estimated values for L, C, and the resistance R of resistor 106, and for value differences in these parameters that may arise due to, for example, age, temperature, offsets, delays, or package stress. In an embodiment, the value of the negative delay τ− may vary within a range from 100 picoseconds to 100 nanoseconds, but embodiments are not limited thereto.

In an embodiment, because the positive delay signal Pt+ is asserted in response to an assertion (a rising edge) of the switch signal SW and the negative delay signal Pt− is asserted in response to a de-assertion (a falling edge) of the switch signal SW, and the positive delay τ+ and the negative delay τ− are substantially smaller than half a clock cycle of the switch signal SW, the positive delay signal Pt+ and the negative delay signal Pt− are each only asserted when the other is in a de-asserted state.

The OR gate 314 operates to produce a signal that is asserted whenever the positive delay signal Pt+, the negative delay signal Pt−, or both are asserted, and is de-asserted otherwise. The pulse generator 316 generates a short pulse in response to the de-assertion of the signal produced by the OR gate 314. As a result, the pulse generator 316 generates a short pulse in response to either the positive delay signal Pt+ or the negative delay signal Pt− being de-asserted. The duration of the short pulse is selected to guarantee that it is long enough to set the SRFF 318.

The SRFF 318 receives the output of the pulse generator 316 on its Set input and receives a zero detect signal ZD on its Reset input. As a result, the output Q of the SRFF 318 is asserted in response to the positive delay signal Pt+ or the negative delay signal Pt− being de-asserted, and the output Q of the SRFF 318 is de-asserted in response to the zero detect signal ZD being asserted.

The XOR gate 320 produces the Q-cell signal $V_{QC}$ by outputting the switch signal SW when the output Q of the SRFF 318 is de-asserted and inverting the switch signal SW when the output Q of the SRFF 318 is asserted.

The zero detect circuit 322 produces a pulse on the zero detect signal ZD whenever the capacitance current $I_C$ sourced to or sunk from the gate capacitance $C_G$ becomes or passes through zero. In the embodiment of FIG. 3, the zero detect circuit 322 determines that the capacitance current $I_C$ is equal to or has passed through zero when the voltage drop $V_R$ across the resistor 306, measured using the positive current sense signal $ICS_P$ and the negative current sense signal $ICS_N$, is equal to or has passed through zero volts, but embodiments are not limited thereto. The pulses produced on the zero detect signal ZD are sufficiently long to reset the SRFF 318 and to allow the S/H circuit 324 to accurately sample the capacitance voltage $V_C$.

The S/H circuit 324 samples the capacitance voltage $V_C$ at a time immediately after the zero detect signal ZD indicates that the capacitance current $I_C$ sourced to or sunk from the gate capacitance $C_G$ has become or passed through zero, and holds the sampled voltage value until the next time the zero detect signal ZD indicates that the capacitance current $I_C$ sourced to or sunk from the gate capacitance $C_G$ has become or passed through zero.

The positive-level comparator 326 compares the sampled capacitance voltage $V_C$ output by the S/H circuit 324 to the maximum voltage value $V_{DD}$ of the gate driver output $V_{GD}$. The positive-level comparator 326 asserts the positive feedback signal FB+ when the sampled capacitance voltage $V_C$ is greater than the maximum voltage value $V_{DD}$.

The positive adaptive delay circuit 310 may decrease the positive delay τ+ in response to the positive feedback signal FB+ being asserted at a positive feedback sampling time during a clock cycle of the switch signal SW, and may increase the positive delay τ+ in response to the positive feedback signal FB+ being de-asserted at the positive feedback sampling time. In an embodiment, the positive feedback sampling time may correspond to the time of de-assertion (that is, the falling edge) of the switch signal SW. In another embodiment, the positive feedback sampling time may correspond to a predetermined delay after the pulse on the zero detect signal ZD.

The negative-level comparator 328 compares the sampled capacitance voltage $V_C$ output by the S/H circuit 324 to 0V. The negative-level comparator 328 asserts the negative feedback signal FB– when the sampled capacitance voltage $V_C$ is greater than 0V.

The negative adaptive delay circuit 312 may increase the negative delay τ– in response to the negative feedback signal FB– being asserted at a negative feedback sampling time during a clock cycle of the switch signal SW, and may decrease the negative delay τ– in response to the negative feedback signal FB– being de-asserted at the negative feedback sampling time. In an embodiment, the negative feedback sampling time may correspond to the time of assertion (that is, the rising edge) of the switch signal SW. In another embodiment, the negative feedback sampling time may correspond to a predetermined delay after the pulse on the zero detect signal ZD.

Figure 4:
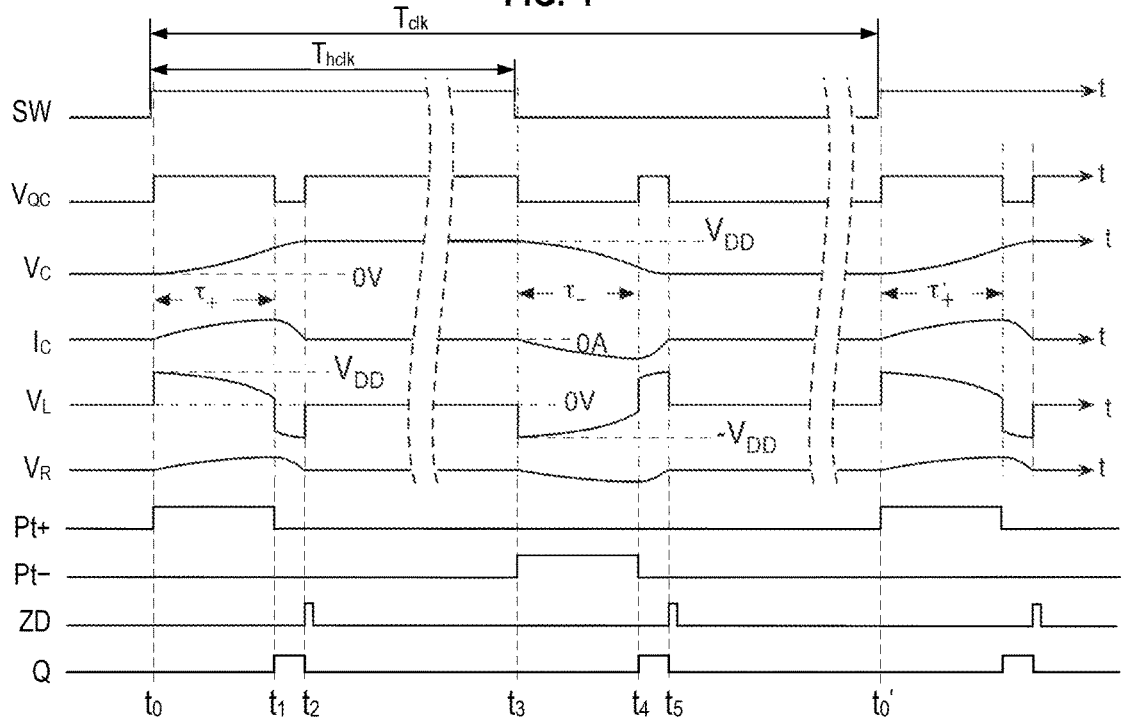
FIG. 4 illustrates operation of the circuit of FIG. 3 according to an embodiment.

FIG. 4 illustrates operation of the circuit 300 of FIG. 3 according to an embodiment. Shown in FIG. 4 are the switch signal SW, the Q-cell signal $V_{QC}$, the capacitance voltage $V_C$, the capacitance current $I_C$, an inductor voltage $V_L$ across the interconnect inductance $L_P$, a voltage drop $V_R$ across the resistor 306, the positive delay signal Pt+, the negative delay signal Pt–, the zero detect signal ZD, and the output Q of the SRFF 318.

At a zeroth time $t_0$, the switch signal SW is asserted. Because the output Q of the SRFF 318 is de-asserted, the Q-Cell logic circuit 302 asserts the Q-cell signal $V_{QC}$ in response to the switch signal SW being asserted, the output of the driver circuit 304 is driven to maximum voltage value $V_{DD}$, and the capacitance current $I_C$ flows into the gate capacitance $C_G$, causing the capacitance voltage $V_C$ to rise. The capacitance current $I_C$ flowing from the driver circuit 304 to the gate capacitance $C_G$ causes the inductor voltage $V_L$ and the voltage drop $V_R$ to develop. The voltage drop $V_R$ is proportional to the capacitance current $I_C$. The inductor voltage $V_L$ is initially equal to the output voltage of the driver circuit 304 but decreases as the magnetic field of the interconnect inductance $L_P$ increases increase in strength.

Also in response to the switch signal SW being asserted at the zeroth time $t_0$, the positive adaptive delay circuit 310 produces a pulse having a duration corresponding to the current value of the positive delay τ+ on the positive delay signal Pt+.

At the first time $t_1$, the pulse on the positive delay signal Pt+ ends, and in response the output Q of the SRFF 318 goes high, which causes the Q-cell signal $V_{QC}$ to go low, and the driver circuit 304 to drive its output low.

The output of the driver circuit 304 being driven low causes the interconnect inductance $L_P$ to release the energy stored in its magnetic field, causing the inductance voltage $V_L$ to go negative as the capacitance current $I_C$ continues to flow and the capacitance voltage $V_C$ continues to rise. As the magnetic field of the interconnect inductance $L_P$ decreases, the capacitance current $I_C$ also decreases.

At a second time $t_2$, the magnetic field of the interconnect inductance $L_P$ goes to zero and as a result the capacitance current $I_C$ goes to zero. Because the capacitance current $I_C$ is zero, the voltage drop $V_R$ across the resistor 306 is also zero. This causes the zero detect circuit 322 to output a pulse on the zero detect signal ZD.

In response to the pulse on the zero detect signal ZD, the output Q of the SRFF 318 is de-asserted, causing the Q-cell signal $V_{QC}$ to be asserted, which causes the output of the driver circuit 304 to be driven to the maximum voltage value $V_{DD}$.

If the capacitance voltage $V_C$ is at the maximum voltage value $V_{DD}$ at this time, no current flows from the driver circuit 403 to the gate capacitance $C_G$, so the capacitance current $I_C$, voltage drop $V_R$, and inductor voltage $V_L$ all remain at zero. If the capacitance voltage $V_C$ is not equal to the maximum voltage value $V_{DD}$ at this time, current will flow to or from the gate capacitance $C_G$ until the capacitance voltage $V_C$ is equal to the maximum voltage value $V_{DD}$. The Q-Cell logic circuit 302 operates to adjust the positive delay τ+ so that the capacitance voltage $V_C$ is at the maximum voltage value $V_{DD}$ when the magnetic field of the interconnect inductance $L_P$ goes to zero while the switch signal SW is asserted.

Also in response to the pulse on the zero detect signal ZD, the S/H circuit 324 samples and holds the value of the capacitance voltage $V_C$. The positive-level comparator 326 produces the positive feedback signal FB+ by asserting the positive feedback signal FB+ when the capacitance voltage $V_C$ is greater than the maximum voltage value $V_{DD}$, and de-asserting the positive feedback signal FB+ otherwise. Accordingly, during the time starting at the end of the pulse on the zero detect signal ZD following the second time $t_2$ and ending at the next pulse on the zero detect signal ZD at a fifth time $t_5$, the output of the S/H circuit 324 corresponds to the value of the capacitance voltage $V_C$ at the second time $t_2$, and the positive feedback signal FB+ is asserted if the capacitance voltage $V_C$ was higher at the second time $t_2$ than the maximum voltage value $V_{DD}$.

At a time $t_3$, the switch signal SW is de-asserted. Because the output Q is de-asserted, the Q-Cell logic circuit 302 de-asserts the Q-cell signal $V_{QC}$ in response to the switch signal SW being de-asserted, the output of the driver circuit 304 is driven to zero volts, and the capacitance current $I_C$ flows from the gate capacitance $C_G$, causing the capacitance voltage $V_C$ to decrease. The capacitance current $I_C$ flowing to the driver circuit 304 from the gate capacitance $C_G$ causes the inductor voltage $V_L$ and the voltage drop $V_R$ to develop. The voltage drop $V_R$ is proportional to the capacitance current $I_C$. The inductor voltage $V_L$ is initially equal to the negative of the capacitance voltage $V_C$, but the magnitude of the inductor voltage $V_L$ decreases as the magnetic field of the interconnect inductance $L_P$ increases in strength.

Also in response to the switch signal SW being de-asserted at the third time $t_3$, the negative adaptive delay circuit 312 produces a pulse having a duration corresponding to the current value of the negative delay $\tau-$ on the negative delay signal Pt−.

In an embodiment, also in response to switch signal SW being de-asserted at the third time $t_3$, the positive adaptive delay circuit 310 may adjust the value of the positive delay $\tau+$ according to the positive feedback signal FB+. When the positive feedback signal FB+ is asserted, indicating that the capacitance voltage $V_C$ may have had a higher than desired value at the time when the magnetic field of the interconnect inductance $L_P$ went to zero, the positive adaptive delay circuit 310 may decrease the value of the positive delay $\tau+$. When the positive feedback signal FB+ is de-asserted, indicating that the capacitance voltage $V_C$ may have had a lower than desired value at the time when the magnetic field of the interconnect inductance $L_P$ went to zero, the positive adaptive delay circuit 310 may increase the value of the positive delay $\tau+$. The new value of the positive delay $\tau+$ is indicated as $\tau_+'$ in FIG. 4.

At the fourth time $t_4$, the pulse on the negative delay signal Pt− ends, and in response the output Q of the SRFF 318 goes high, which causes the Q-cell signal $V_{QC}$ to go high, and the driver circuit 304 to drive its output to the maximum voltage value $V_{DD}$.

The output of the driver circuit 304 being driven to the maximum voltage value $V_{DD}$ causes the interconnect inductance $L_P$ to release the energy stored in its magnetic field, causing the inductance voltage $V_L$ to go positive as the capacitance current $I_C$ continues to flow from the gate capacitance $C_G$ and the capacitance voltage $V_C$ continues to decrease. As the magnitude of the magnetic field of the interconnect inductance $L_P$ decreases, the magnitude of the capacitance current $I_C$ also decreases.

At a fifth time $t_5$, the magnetic field of the interconnect inductance $L_P$ goes to zero and as a result the capacitance current $I_C$ goes to zero. Because the capacitance current $I_C$ is zero, the voltage drop $V_R$ across the resistor 306 is also zero. This causes the zero detect circuit 322 to output a pulse on the zero detect signal ZD.

In response to the pulse on the zero detect signal ZD, the output Q of the SRFF 318 is de-asserted, causing the Q-cell signal $V_{QC}$ to be de-asserted, which causes the output of the driver circuit 304 to be driven to zero volts.

If the capacitance voltage $V_C$ is zero at this time, no current flows between the driver circuit 403 to the gate capacitance $C_G$, so the capacitance current $I_C$, voltage drop $V_R$, and inductor voltage $V_L$ all remain at zero. If the capacitance voltage $V_C$ is not equal to the maximum voltage value $V_{DD}$ at this time, current will flow to or from the gate capacitance $C_G$ until the capacitance voltage $V_C$ is equal to zero. The Q-Cell logic circuit 302 operates to adjust the negative delay $\tau-$ so that the capacitance voltage $V_C$ is at zero when the magnetic field of the interconnect inductance $L_P$ goes to zero while the switch signal SW is de-asserted.

Also in response to the pulse on the zero detect signal ZD, the S/H circuit 324 samples and holds the value of the capacitance voltage $V_C$. The negative-level comparator 328 produces the negative feedback signal FB− by asserting the negative feedback signal FB− when the capacitance voltage $V_C$ is greater than zero, and de-asserting the negative feedback signal FB− otherwise. Accordingly, during the time starting at the end of the pulse on the zero detect signal ZD following the fifth time $t_5$ and ending at the next pulse on the zero detect signal ZD (which occurs in the next cycle of the switch signal SW), the output of the S/H circuit 324 corresponds to the value of the capacitance voltage $V_C$ at the second time $t_2$, and the negative feedback signal FB− is asserted if the capacitance voltage $V_C$ was greater than zero at the fifth time $t_5$.

In an embodiment, in response to switch signal SW being asserted at the second zeroth time $t_0'$ (i.e., at the beginning of the second cycle of the switch signal SW), the negative adaptive delay circuit 312 may adjust the value of the negative delay $\tau-$ according to the negative feedback signal FB−. When the negative feedback signal FB− is asserted, indicating that the capacitance voltage $V_C$ may have had a higher than desired value at the last time at which the magnetic field of the interconnect inductance $L_P$ went to zero, the negative adaptive delay circuit 312 may increase the value of the negative delay $\tau-$. When the positive feedback signal FB− is de-asserted, indicating that the capacitance voltage $V_C$ may have had a lower than desired value at the last time at which the magnetic field of the interconnect inductance $L_P$ went to zero, the negative adaptive delay circuit 312 may decrease the value of the negative delay $\tau-$.

Accordingly, the Q-Cell logic circuit 302 continuously adjusts the positive delay $\tau+$ so that after a rising edge of the switch signal SW, the capacitance voltage $V_C$ reaches a desired high level at a time when the energy stored in the interconnect inductance $L_P$ goes to zero, and adjusts the negative delay $\tau-$ so after a falling edge of the switch signal SW, the capacitance voltage $V_C$ reaches a desired low level at a time when the energy stored in the interconnect inductance $L_P$ goes to zero. The lack of stored energy in the interconnect inductance $L_P$ prevents ringing of the capacitance voltage $V_C$.

Figure 5:
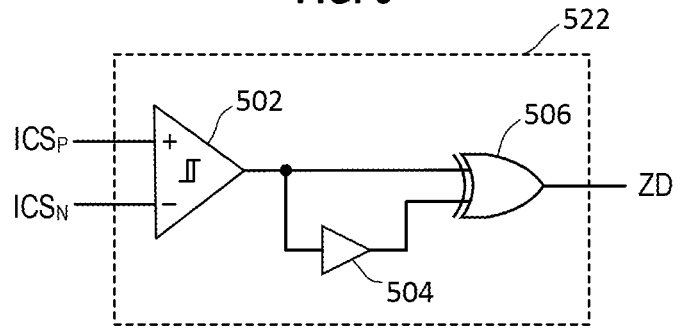
FIG. 5 illustrates a zero detect circuit.

FIG. 5 illustrates a zero detect circuit 522 which in an embodiment may be used in the zero detect circuit 332 of FIG. 3. The zero detect circuit 522 includes a comparator 502, a buffer 504 having a propagation delay, and an XOR gate 506. In the embodiment shown, the comparator 502 incorporates hysteresis, but embodiments are not limited thereto.

The comparator 502 receives a positive current sense signal $ICS_P$ and a negative current sense signal $ICS_N$. The positive current sense signal $ICS_P$ and the negative current sense signal $ICS_N$ may have a voltage difference corresponding to the capacitance current $I_C$. The output of the comparator 502 is asserted when a voltage of the positive current sense signal $ICS_P$ is greater than a voltage of the negative current sense signal $ICS_N$, and de-asserted otherwise.

The buffer 504 and XOR gate 506 operate to produce a short pulse (having a duration corresponding to the propagation delay of the buffer 504) in response to each high-to-low or low-to-high transition of the output of the comparator 502. As a result, the zero detect circuit 522 produces a pulse each time the capacitance current $I_C$ passes through zero.

Figure 6A:
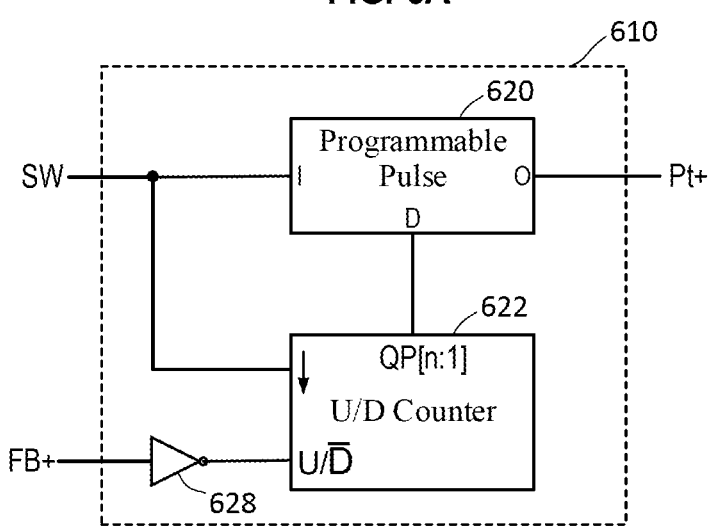
FIG. 6A illustrates a τ+ delay circuit according to an embodiment.

FIG. 6A illustrates a positive adaptive delay circuit 610 which in an embodiment may be used in the positive adaptive delay circuit 310 of FIG. 3. The positive adaptive delay circuit 610 includes a programmable pulse generator 620, an up/down (U/D) counter 622, and an inverter 628. The positive adaptive delay circuit 610 receives the switch signal SW and the positive feedback signal FB+, and produces the positive delay signal Pt+.

The inverter 628 receives the positive feedback signal FB+ and provides an inverted version of it to the U/D input of the U/D counter 622. Accordingly, the U/D counter 622 will, when clocked, count up when the positive feedback signal FB+ is de-asserted and count down when the positive feedback signal FB+ is asserted.

The U/D counter 622 counts in response to a falling edge of the switch signal SW, counting up when the positive feedback signal FB+ is de-asserted and counting down when the positive feedback signal FB+ is asserted to produce an n-bit positive delay count QP[n:1]. In an embodiment, n may be 6 or more, but embodiments are not limited thereto. In an embodiment, the U/D counter 622 may include circuits to receive and load an initial positive count value into the positive delay count QP.

The programmable pulse generator 620 asserts the positive delay signal Pt+ for a duration corresponding to the positive delay count QP in response to a rising edge of the switch signal SW, and de-asserts the positive delay signal Pt+ in response to that duration elapsing.

Figure 6B:
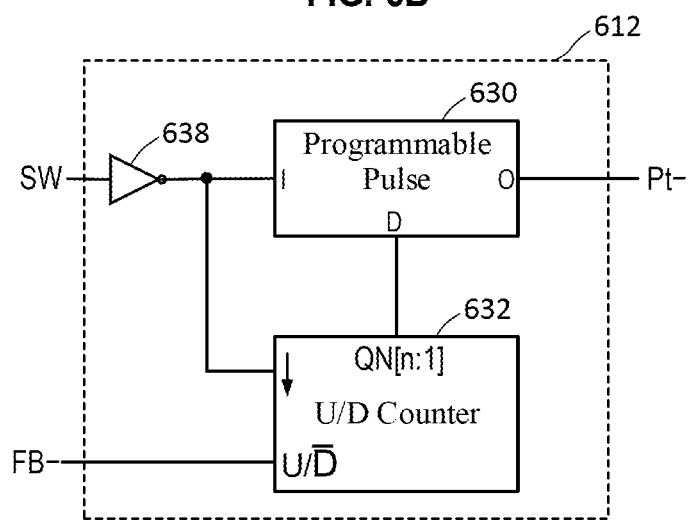
FIG. 6B illustrates a τ− delay circuit according to an embodiment.

FIG. 6B illustrates a negative adaptive delay circuit 612 which in an embodiment may be used in the negative adaptive delay circuit 312 of FIG. 3. The negative adaptive delay circuit 612 includes a programmable pulse generator 630, an up/down (U/D) counter 632, and an inverter 638. The negative adaptive delay circuit 612 receives the switch signal SW and the negative feedback signal FB−, and produces the negative delay signal Pt−.

The inverter 638 receives the switch signal SW and provides an inverted version of it to the trigger input of the programmable pulse generator 630 and to the clock input of the U/D counter 632. Accordingly, programmable pulse generator 630 will generate a pulse in response to a falling edge of the switch signal SW, and the U/D counter 622 will count in response to a rising edge of the switch signal SW.

The U/D counter 632 counts in response to a rising edge of the switch signal SW, counting up when the negative feedback signal FB− is asserted and counting down when the negative feedback signal FB− is de-asserted to produce an n-bit negative delay count QN[n:1]. In an embodiment, n may be 6 or more, but embodiments are not limited thereto. In an embodiment, the U/D counter 632 may include circuits to receive and load an initial negative count value into the negative delay count QN.

The programmable pulse generator 630 asserts the negative delay signal Pt− for a duration corresponding to the negative delay count QN in response to a falling edge of the switch signal SW, and de-asserts the negative delay signal Pt− in response to that duration elapsing.

Figure 7A:
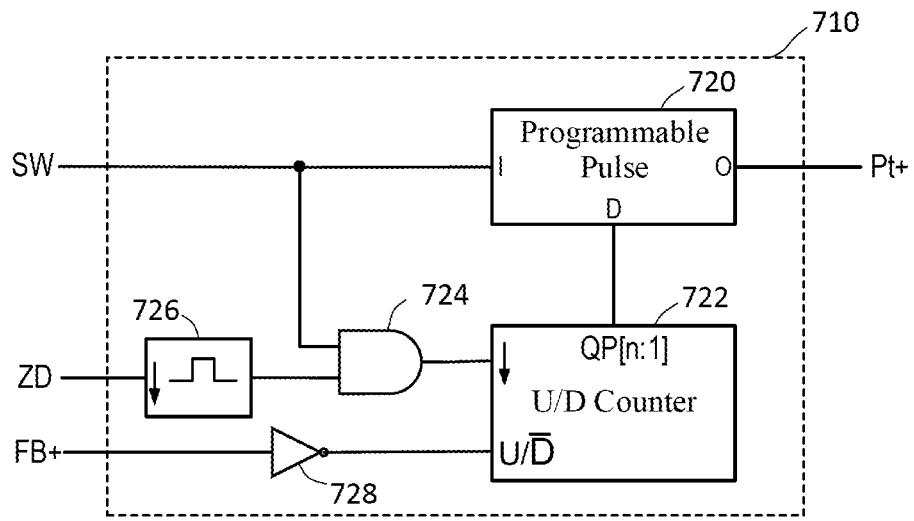
FIG. 7A illustrates a τ+ delay circuit according to another embodiment.

FIG. 7A illustrates a positive adaptive delay circuit 710 which in an embodiment may be used in the positive adaptive delay circuit 310 of FIG. 3. The positive adaptive delay circuit 710 includes a programmable pulse generator 720, and an up/down (U/D) counter 722, an AND gate 724, a fixed pulse generator 726, and an inverter 728. The positive adaptive delay circuit 710 receives the switch signal SW, the zero detect signal ZD, and the positive feedback signal FB+, and produces the positive delay signal Pt+.

The inverter 728 receives the positive feedback signal FB+ and provides an inverted version of it to the U/D input of the U/D counter 722. Accordingly, the U/D counter 722 will, when clocked, count up when the positive feedback signal FB+ is de-asserted and count down when the positive feedback signal FB+ is asserted.

The fixed pulse generator 726 produces a pulse having a predetermined duration in response to a falling edge of the zero detect signal ZD. The predetermined duration may correspond to the sum of a settling time of S/H circuit 324 of FIG. 3 and a propagation time of the positive-level comparator 326 of FIG. 3.

When the switch signal SW is asserted, the AND gate 724 outputs a pulse according to the output of the fixed pulse generator 726; the output of the AND gate therefore has a falling edge only when the fixed pulse generator 726 has a falling edge while the switch signal SW is asserted.

The U/D counter 722 counts in response to a falling edge of the output of the AND gate 724, counting up when the positive feedback signal FB+ is de-asserted and counting down when the positive feedback signal FB+ is asserted to produce an n-bit positive delay count QP[n:1]. Accordingly, the U/D counter 722 updates the value of the positive delay count QP a predetermined time after the sampling of the capacitance voltage $V_C$ during a period when the switch signal SW is asserted. In an embodiment, the U/D counter 722 may include circuits to receive and load an initial positive count value into the positive delay count QP.

The programmable pulse generator 720 asserts the positive delay signal Pt+ for a duration corresponding to the positive delay count QP in response to a rising edge of the switch signal SW, and de-asserts the positive delay signal Pt+ in response to that duration elapsing.

Figure 7B:
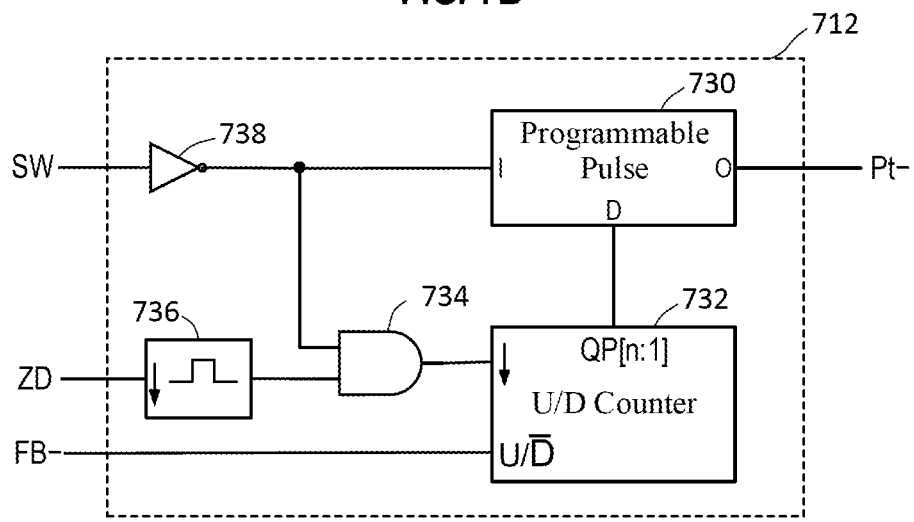
FIG. 7B illustrates a τ− delay circuit according to another embodiment.

FIG. 7B illustrates a negative adaptive delay circuit 712 which in an embodiment may be used in the negative adaptive delay circuit 312 of FIG. 3. The negative adaptive delay circuit 712 includes a programmable pulse generator 730, an up/down (U/D) counter 732, an AND gate 734, a fixed pulse generator 736, and an inverter 738. The negative adaptive delay circuit 712 receives the switch signal SW, the zero detect signal ZD, and the negative feedback signal FB−, and produces the negative delay signal Pt−.

The inverter 738 receives the switch signal SW and provides an inverted version of it to the trigger input of the programmable pulse generator 730 and to an input of the AND gate 734. Accordingly, the programmable pulse generator 730 will generate a pulse in response to a falling edge of the switch signal SW.

The fixed pulse generator 736 produces a pulse having a predetermined duration in response to a falling edge of the zero detect signal ZD. The predetermined duration may correspond to the sum of a settling time of S/H circuit 324 of FIG. 3 and a propagation time of the negative-level comparator 328 of FIG. 3.

When the switch signal SW is de-asserted, the AND gate 734 outputs a pulse according to the output of the fixed pulse generator 736; the output of the AND gate therefore has a falling edge when the fixed pulse generator 736 has a falling edge while the switch signal SW is de-asserted.

The U/D counter 732 counts in response to the falling edge of the output of the AND gate 734, counting up when the negative feedback signal FB− is asserted and counting down when the negative feedback signal FB− is de-asserted to produce an n-bit negative delay count QN[n:1]. Accordingly, the U/D counter 732 updates the value of the negative delay count QN a predetermined time after the sampling of the capacitance voltage $V_C$ during a period when the switch signal SW is de-asserted. In an embodiment, the U/D counter 732 may include circuits to receive and load an initial negative count value into the negative delay count QN.

The programmable pulse generator 730 asserts the negative delay signal Pt− for a duration corresponding to the negative delay count QN in response to a falling edge of the switch signal SW, and de-asserts the negative delay signal Pt− in response to that duration elapsing.

Figure 8:
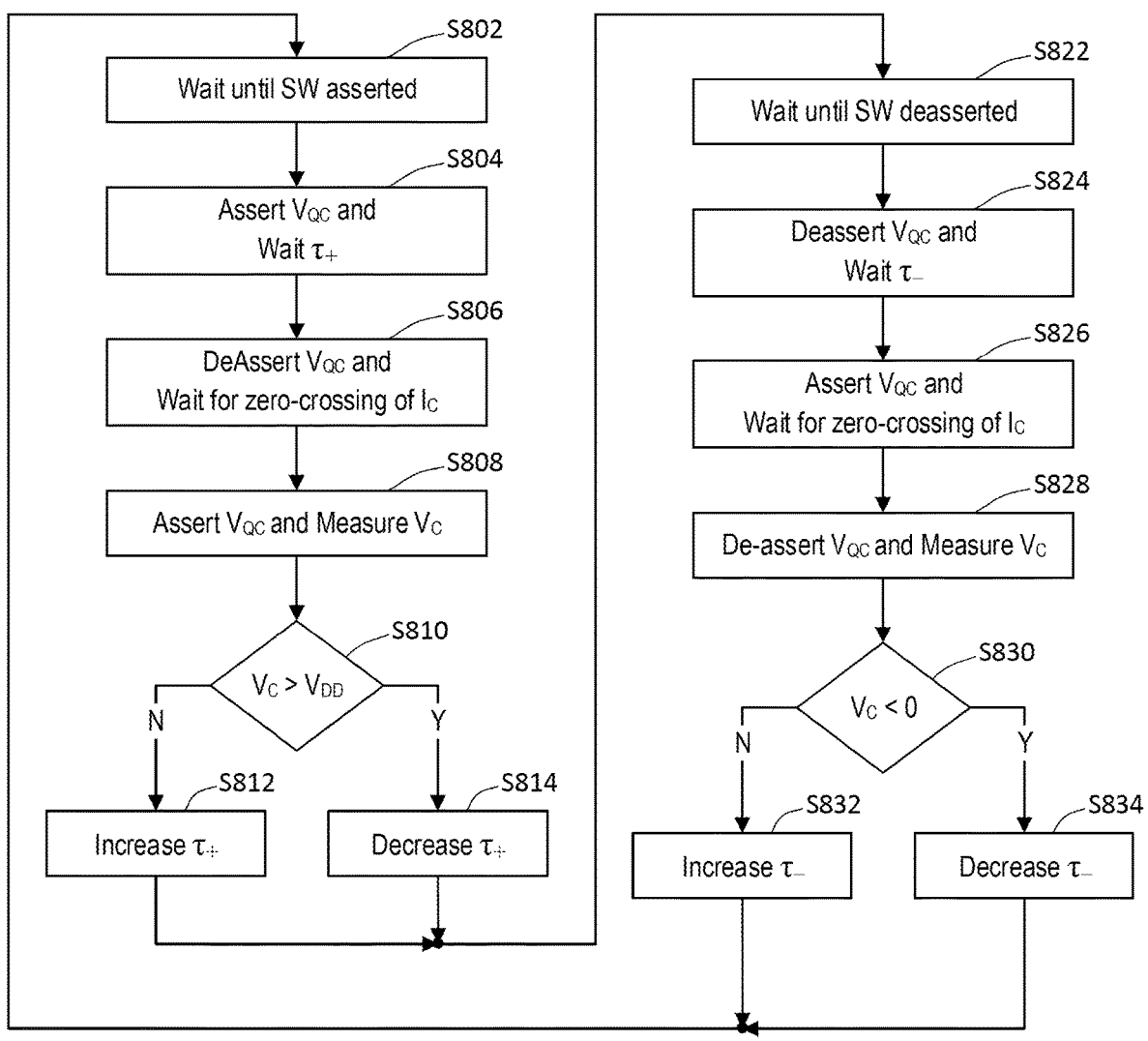
FIG. 8 illustrates a process for generating a drive signal according to an embodiment.

FIG. 8 illustrates a process 800 for generating a drive signal according to an embodiment. The process 800 may be performed using a circuit such as the Q-Cell logic circuit 302 of FIG. 3, but embodiments are not limited thereto.

At S802, the process 800 waits for a switch signal SW to be asserted (for example, by waiting for the rising edge of an active-high signal). In response to the switch signal SW being asserted, the process 800 proceeds to S804.

At S804, the process 800 asserts a Q-Cell output $V_{QC}$ and then waits a positive delay τ+. In response to the positive delay τ+ elapsing, the process 800 proceeds to S806.

At S806, the process 800 de-asserts the Q-Cell output $V_{QC}$ and then waits for a zero crossing of a current being controlled by the Q-Cell output $V_{QC}$, here, a capacitance current $I_C$ of a capacitive load being driven according to the Q-Cell output $V_{QC}$. In response to the zero crossing of the capacitance current $I_C$, the process 800 proceeds to S808.

At S808, the process 800 asserts the Q-Cell output $V_{QC}$ and measures a voltage produced according to the current of S806; in this example the voltage that is measured is a capacitance voltage $V_C$ generated according to the capacitance current $I_C$.

At S810, the process 800 compares the measured voltage (the capacitance voltage $V_C$) against a positive target voltage. Here, the positive target voltage is the maximum voltage value $V_{DD}$ that can be output by the circuit that is the source of the capacitance current $I_C$, but embodiments are not limited thereto. When the measured voltage is greater than the positive target voltage, at S810 the process 800 proceeds to S814; otherwise the process 800 proceeds to S812.

At S812, the process 800 increases the positive delay τ+ and then proceeds to S822.

At S814, the process 800 decreases the positive delay τ+ and then proceeds to S822.

At S822, the process 800 waits for the switch signal SW to be de-asserted (for example, by waiting for the falling edge of an active-high signal). In response to the switch signal SW being de-asserted, the process 800 proceeds to S824.

At S824, the process 800 de-asserts the Q-Cell output $V_{QC}$ and then waits a negative delay τ–. In response to the negative delay τ– elapsing, the process 800 proceeds to S826.

At S826, the process 800 asserts the Q-Cell output $V_{QC}$ and then waits for a zero crossing of the current being controlled by the Q-Cell output $V_{QC}$; here, the capacitance current $I_C$. In response to the zero crossing of the capacitance current $I_C$, the process 800 proceeds to S828.

At S828, the process 800 de-asserts the Q-Cell output $V_{QC}$ and measures a voltage produced according to the current of S826; in this example the capacitance voltage $V_C$ generated according to the capacitance current $I_C$.

At S830, the process 800 compares the measured voltage (the capacitance voltage $V_C$) against a negative target voltage. Here, the negative target voltage may be zero volts, but embodiments are not limited thereto. When the measured voltage is greater than the negative target voltage, at S830 the process 800 proceeds to S834; otherwise the process 800 proceeds to S832.

At S832, the process 800 decreases the negative delay τ– and then proceeds to S802

At S834, the process 800 increases the negative delay τ– and then proceeds to S802.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, a power device may have a metal pattern with different thicknesses on the front side and another metal pattern with different thicknesses on the backside to enable lifetime control treatment to be performed from the both sides. Accordingly, embodiments as set forth herein are intended to be illustrative and not limiting.

What is claimed is:

1. A circuit for driving a control signal, the circuit comprising:
   a zero detect circuit (322) configured to produce a zero detect signal (ZD) indicating a current ($I_C$) becoming zero, the current being generated according to the control signal;
   a first adaptive delay circuit (310, 326) configured to:
      receive a switch signal (SW),
      produce a first delay signal (Pt+) indicating that a first adaptive delay has elapsed since an assertion of the switch signal, and
      adjust the first adaptive delay according to a first target voltage ($V_{DD}$) and an output voltage ($V_C$), the output voltage being generated using the current;
   an output circuit (314, 316, 318, 320) configured to, when the switch signal is asserted:
      assert the control signal in response to the assertion of the switch signal,
      de-assert the control signal in response to the first delay signal indicating that the first adaptive delay has elapsed since the assertion of the switch signal, and
      assert the control signal in response to the zero detect signal indicating the current becoming zero.

2. The circuit of claim 1, further comprising:
   a sampling circuit (324) configure to determine a sampled value of the output voltage at a time corresponding to the current becoming zero,
   wherein first adaptive delay circuit is configured to adjust the first adaptive delay according to the first target voltage and the sampled value.

3. The circuit of claim 2, wherein first adaptive delay circuit is configured to:
   decrease the first adaptive delay in response to the sampled value being greater than the first target voltage, and
   increase the first adaptive delay in response to the sampled value being less than the first target voltage.

4. The circuit of claim 2, wherein the first adaptive delay circuit is configured to adjust the first adaptive delay in response to a de-assertion of the switch signal or at a predetermined time after the time corresponding to the current becoming zero.

5. The circuit of claim 1, wherein the first target voltage is a maximum intended voltage of the output voltage.

6. The circuit of claim 2, comprising:
   a second adaptive delay circuit (312, 328) configured to:
      receive the switch signal,
      produce a second delay signal indicating that a second adaptive delay has elapsed since a de-assertion of the switch signal, and
      adjust the second adaptive delay according to a second target voltage and the output voltage,
   wherein the output circuit is configured to:
      de-assert the control signal in response to the de-assertion of the switch signal,
      assert the control signal in response to the second delay signal indicating that the second adaptive delay has elapsed since the de-assertion of the switch signal, and
      de-assert the control signal in response to the zero detect signal indicating the current becoming zero.

7. The circuit of claim 6, wherein the second adaptive delay circuit is configured to:

increase the second adaptive delay in response to the sampled value being greater than the second target voltage, and decrease the second adaptive delay in response to the sampled value being less than the second target voltage.

8. The circuit of claim 6, wherein the second adaptive delay circuit is configured to adjust the second adaptive delay in response to the assertion of the switch signal or at the predetermined time after the time corresponding to the current becoming zero.

9. The circuit of claim 6, wherein the second target voltage is zero.

10. The circuit of claim 1, wherein the zero detect circuit is configured to indicate the current becoming zero in response to a zero-crossing of the current or a magnitude of the current being less than a zero detect threshold value.

11. A method of producing an output signal, the method comprising:
in response to an assertion of a switch signal:
asserting the control signal,
waiting a first adaptive delay after the assertion of the switch signal,
in response to the expiration of the first adaptive delay, de-asserting the control signal, and
in response to a current generated according to the control signal becoming zero, asserting the control signal; and
adjusting the first adaptive delay according to a first voltage generated using the current.

12. The method of claim 11, wherein the first voltage is a voltage at a time corresponding to the current becoming zero while the switch signal is asserted.

13. The method of claim 12, further comprising adjusting the first adaptive delay a predetermined delay after the time corresponding to the current becoming zero while the switch signal is asserted or at a time corresponding to a de-assertion of the switch signal.

14. The method of claim 11, wherein adjusting the first adaptive delay comprises:
increasing the first adaptive delay when the first voltage is less than a first target value; and
decreasing the first adaptive delay when the first voltage is greater than the first target value.

15. The method of claim 11, further comprising:
in response to a de-assertion of the switch signal:
de-asserting the control signal,
waiting a second adaptive delay after the de-assertion of the switch signal,
in response to the expiration of the second adaptive delay, asserting the control signal, and
in response to a current generated according to the control signal becoming zero, de-asserting the control signal; and
adjusting the second adaptive delay according to a second voltage generated using the current.

16. The method of claim 15, wherein the second voltage is a voltage at a time corresponding to the current becoming zero while the switch signal is de-asserted.

17. The method of claim 12, further comprising adjusting the second adaptive delay a predetermined delay after the time corresponding to the current becoming zero while the switch signal is de-asserted or at a time corresponding to an assertion of the switch signal.

18. The method of claim 15, wherein adjusting the second adaptive delay comprises:
decreasing the second adaptive delay when the second voltage is less than a second target value; and
increasing the second adaptive delay when the second voltage is greater than the second target value.

19. A circuit for driving a control signal, the circuit comprising:
an Exclusive-OR (XOR) gate having a first input coupled to a switch signal and an output coupled to the control signal;
a Set-Reset Flip-Flop (SRFF) having an output coupled to a second input of the XOR gate;
a zero-detect circuit configured to provide a pulse to a Reset input of the SRFF in response to a current generated according to the control circuit becoming zero; and
a delay circuit configured to:
provide a first pulse to a Set input of the SRFF a first adaptive delay after an assertion of the switch signal; and
adjust the first adaptive delay according to a voltage generated by the current.

20. The circuit of claim 19, wherein the delay circuit is further configured to:
provide a second pulse to the Set input of the SRFF a second adaptive delay after a de-assertion of the switch signal; and
adjust the second adaptive delay according to the voltage generated by the current.

* * * * *